(12) United States Patent
Lajoie et al.

(10) Patent No.: US 11,652,047 B2
(45) Date of Patent: May 16, 2023

(54) INTERMEDIATE SEPARATION LAYERS AT THE BACK-END-OF-LINE

(71) Applicant: Intel Corporation, Santa Clara, CA (US)

(72) Inventors: Travis W. Lajoie, Forest Grove, OR (US); Abhishek A. Sharma, Hillsboro, OR (US); Van H. Le, Portland, OR (US); Chieh-Jen Ku, Hillsboro, OR (US); Pei-Hua Wang, Beaverton, OR (US); Jack T. Kavalieros, Portland, OR (US); Bernhard Sell, Portland, OR (US); Tahir Ghani, Portland, OR (US); Gregory George, Beaverton, OR (US); Akash Garg, Portland, OR (US); Julie Rollins, Forest Grove, OR (US); Allen B. Gardiner, Portland, OR (US); Shem Ogadhoh, Beaverton, OR (US); Juan G. Alzate Vinasco, Tigard, OR (US); Umut Arslan, Portland, OR (US); Fatih Hamzaoglu, Portland, OR (US); Nikhil Mehta, Portland, OR (US); Ting Chen, Portland, OR (US); Vinaykumar V. Hadagali, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 807 days.

(21) Appl. No.: 16/457,641

(22) Filed: Jun. 28, 2019

(65) Prior Publication Data
US 2020/0411426 A1 Dec. 31, 2020

(51) Int. Cl.
*H01L 23/528* (2006.01)
*H01L 23/522* (2006.01)
*H01L 27/108* (2006.01)

(52) U.S. Cl.
CPC ........ *H01L 23/528* (2013.01); *H01L 23/5226* (2013.01); *H01L 27/1085* (2013.01); *H01L 27/10805* (2013.01); *H01L 27/10873* (2013.01)

(58) Field of Classification Search
CPC .................................................. H01L 23/528
See application file for complete search history.

(56) References Cited

U.S. PATENT DOCUMENTS

| | | | |
|---|---|---|---|
| 5,068,707 A * | 11/1991 | Pors | .................. H01L 27/10805 257/311 |
| 10,217,746 B1 * | 2/2019 | Kim | .................... H01L 27/1157 |
| 11,270,998 B2 * | 3/2022 | Wang | ................ H01L 27/10897 |

(Continued)

*Primary Examiner* — Caleb E Henry
(74) *Attorney, Agent, or Firm* — Schwabe, Williamson & Wyatt, P.C.

(57) ABSTRACT

Embodiments herein describe techniques for a semiconductor device having an interconnect structure including an inter-level dielectric (ILD) layer between a first layer and a second layer of the interconnect structure. The interconnect structure further includes a separation layer within the ILD layer. The ILD layer includes a first area with a first height to extend from a first surface of the ILD layer to a second surface of the ILD layer. The ILD layer further includes a second area with a second height to extend from the first surface of the ILD layer to a surface of the separation layer, where the first height is larger than the second height. Other embodiments may be described and/or claimed.

19 Claims, 6 Drawing Sheets

(56) References Cited

U.S. PATENT DOCUMENTS

| | | | |
|---|---|---|---|
| 2015/0340316 A1* | 11/2015 | Or-Bach | G11C 5/04 |
| | | | 257/401 |
| 2017/0053906 A1* | 2/2017 | Or-Bach | H01L 27/11575 |
| 2018/0342557 A1* | 11/2018 | Mori | H01L 45/16 |
| 2019/0393356 A1* | 12/2019 | Le | H01L 23/5226 |
| 2020/0098934 A1* | 3/2020 | Shivaraman | H01L 29/513 |
| 2020/0350203 A1* | 11/2020 | Fratin | H01L 27/249 |
| 2020/0388650 A1* | 12/2020 | Nardi | G11C 13/004 |
| 2020/0395407 A1* | 12/2020 | Takahashi | H01L 45/1683 |
| 2020/0395408 A1* | 12/2020 | Takahashi | H01L 27/2427 |
| 2020/0411520 A1* | 12/2020 | Lajoie | H01L 27/1085 |

* cited by examiner

INTERMEDIATE SEPARATION LAYERS AT THE BACK-END-OF-LINE

FIELD

Embodiments of the present disclosure generally relate to the field of semiconductor devices, and more particularly, to the back-end-of-line of semiconductor processing.

BACKGROUND

The semiconductor device fabrication process includes multiple steps, e.g., photolithographic and chemical processing steps, during which electronic circuits are gradually created on a wafer made of semiconductor material. Front-end-of-line (FEOL) processing refers to the formation of the transistors or other semiconductor devices directly in a semiconductor substrate. Once the various semiconductor devices have been created at the front end, back-end-of-line (BEOL) processing steps may be involved to create an interconnect structure above the substrate to interconnect conductive wires or electrodes located in metal layers, which are isolated by dielectric layers. Transistors, e.g., thin film transistors, may be formed at the BEOL as well. There may be various dielectric layers in an interconnect structure, e.g., an inter level dielectric (ILD) layer that may contain low dielectric constant k between adjacent metal lines. The process of making the interconnect structure may involve many steps, which may be very costly.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
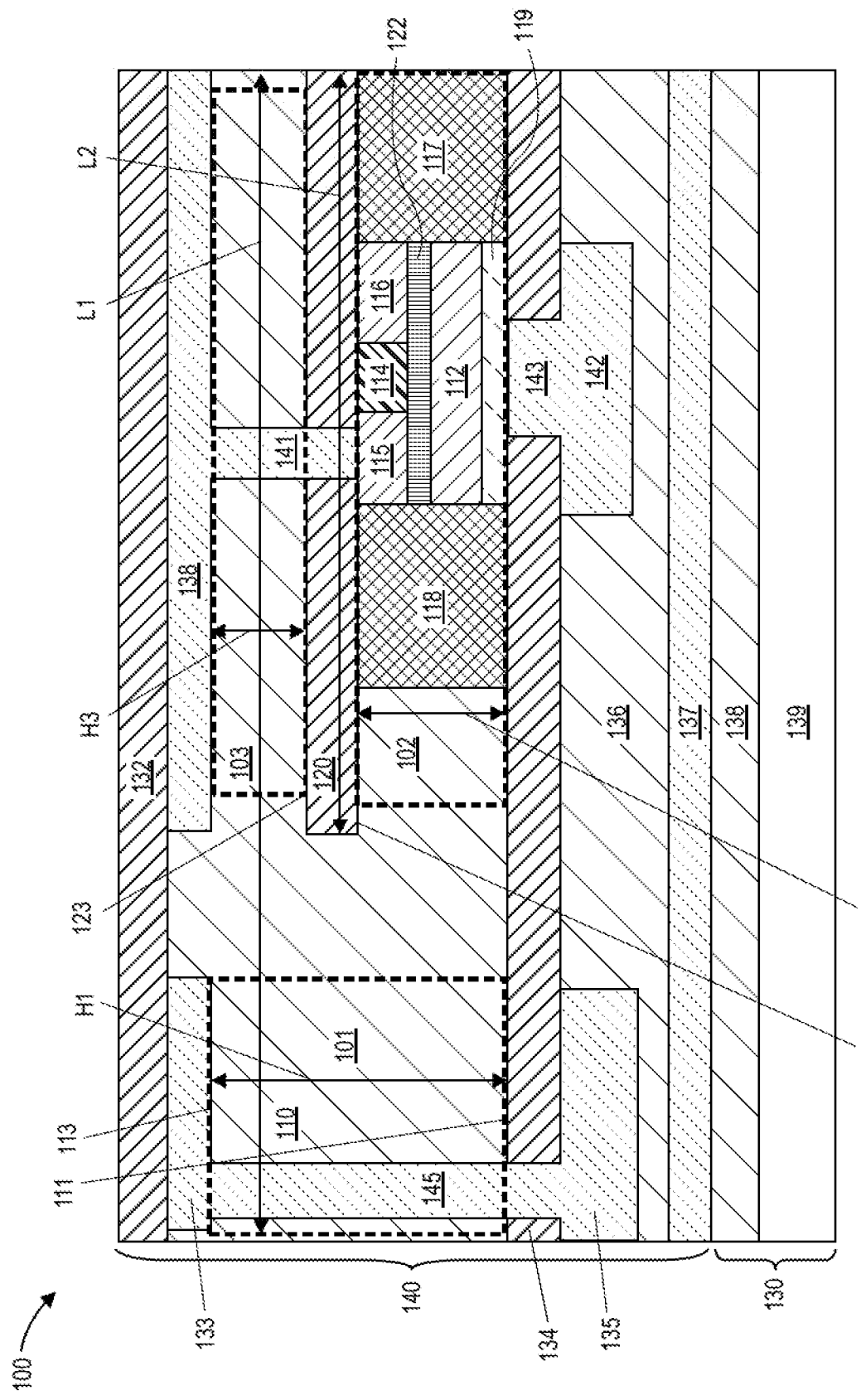
FIG. 1 schematically illustrates a diagram of a semiconductor device including an intermediate separation layer within an inter level dielectric (ILD) layer in back-end-of-line (BEOL), in accordance with some embodiments.

Front-end-of-line (FEOL) semiconductor processing and structures may refer to a first portion of IC fabrication where individual devices (e.g., transistors, capacitors, resistors, etc.) are patterned in a semiconductor substrate or layer. FEOL generally covers everything up to (but not including) the deposition of metal interconnect layers. A transistor formed in FEOL may also be referred to as a front-end transistor. Following the last FEOL operation, the result is typically a wafer with isolated transistors (e.g., without any wires). Back end of line (BEOL) semiconductor processing and structures may refer to a second portion of IC fabrication where the individual devices (e.g., transistors, capacitors, resistors, etc.) are interconnected with wiring on the wafer, e.g., the metallization layer or layers. BEOL includes an interconnect structure having metal contacts, dielectrics layers, e.g., inter-level dielectric (ILD) layers, metal levels, and bonding sites for chip-to-package connections. In the BEOL part of the fabrication, metal contacts, pads, interconnect wires, vias, and dielectric structures may be formed. For modern IC processes, more than 10 metal layers may be added in the BEOL. A thin film transistor (TFT) is a kind of field-effect transistor formed at BEOL and including a channel layer, a gate electrode, and source and drain electrodes, over a supporting but non-conducting substrate.

In some current fabrication process, devices of a memory array may be formed within an ILD layer. Afterwards, a separation layer, e.g., an etch stop layer, may be used to seal devices within the memory array, which may cover the entire memory array. Such separation layers may interrupt logic connections and would require extra patterning steps to contact under layer from above the memory array. As a result, the cost of such fabrication process may be high.

Embodiments herein may form a patterned separation layer, e.g., an etch stop layer, within an ILD layer, or between two layers of the BEOL. The so formed separation layer may be an intermediate separation layer, which may be shorter than the normal ILD layer. Hence, such an intermediate separation layer only covers part of the ILD layer. The separation layer seals a device to separate some area of the ILD layer into a middle ILD layer and a top ILD layer, while leaving the rest of the area of the ILD layer open. As a result, the middle ILD layer and the top ILD layer are accessible using one patterning step to contact above and below the device level. The devices of a memory array may be sealed by the intermediate separation layer, while allowing only one set of patterning to access both the under layer and the memory array, essentially saving two patterning steps. Hence, the cost of fabrication can be reduced.

Embodiments herein may present a semiconductor device including an interconnect structure above a substrate. The interconnect structure includes an ILD layer between a first layer and a second layer. The ILD layer has a first surface adjacent to the first layer, and a second surface adjacent to the second layer, with a first height measured vertically between the first surface and the second surface, and a length of the ILD layer measured horizontally in parallel with a surface of the substrate. The interconnect structure further includes a separation layer within the ILD layer. The separation layer has a first surface opposite to the first surface of the ILD layer, and a second surface opposite to the second surface of the ILD layer. The ILD layer includes a first area with the first height to extend from the first surface of the ILD layer to the second surface of the ILD layer. The ILD layer further includes a second area with a second height to extend from the first surface of the ILD layer to the first surface of the separation layer, where the first height is larger than the second height. The separation layer contains a material different from a dielectric material of the ILD layer.

Embodiments herein may present a method for forming a semiconductor device. The method includes forming an ILD layer including a dielectric material above a first layer and a substrate. The ILD layer includes a first area with a first height measured vertically from a first surface of the ILD layer adjacent to the first layer to a second surface of the ILD layer vertically opposite to the first surface. The method further includes forming an opening of the ILD layer, wherein the opening is outside the first area. Moreover, the method includes forming one or more active or passive devices to occupy a first portion of the opening, where the first portion of the opening has a second height that is smaller than the first height. Afterwards, the method includes forming a separation layer within the opening to cover the one or more active or passive devices, where the opening has a second portion not filled by the separation layer or the one or more active or passive devices. In addition, the method includes filling the second portion of the opening by the dielectric material, where the dielectric material filling the second portion of the opening has a surface that is coplanar with the second surface of the ILD layer. Furthermore, the method includes forming a second layer above the ILD layer.

Embodiments herein may present a computing device, which may include a circuit board, and a memory device coupled to the circuit board and including a memory array. In more detail, the memory array may include a plurality of memory cells. A memory cell of the plurality of memory cells includes a transistor and a capacitor formed within an ILD layer including a dielectric material above a first layer and a substrate. The transistor includes a gate electrode, and a channel layer including a channel material and separated from the gate electrode by a gate dielectric layer. The transistor further includes a source electrode and a drain electrode above the channel layer. The gate electrode, the channel layer, the source electrode and the drain electrode are above the first layer and below a separation layer. The capacitor is above the separation layer and below a second layer. The ILD layer includes a first area with a first height to extend from a first surface of the ILD layer to a second surface of the ILD layer between the first layer and the second layer. The ILD layer further includes a second area with a second height to extend between the first layer and the separation layer, where the first height is larger than the second height. The drain electrode of the transistor is coupled to a bottom plate of the capacitor through the separation layer, a top plate of the capacitor is coupled to a source line of the memory array, and the gate electrode of the transistor is coupled to a word line of the memory array.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, or zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, or conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, or aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, or silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), or organosilicates such as silsesquioxane, siloxane, or organosilicate glass. The ILD layers may include pores or air gaps to further reduce their dielectric constant.

FIG. 1 schematically illustrates a diagram of a semiconductor device 100 including an intermediate separation layer 120 within an ILD layer 110 in BEOL, in accordance with some embodiments. The intermediate separation layer 120 may be a separation layer shorter than an ILD layer.

In embodiments, the semiconductor device 100 includes the FEOL 130 including a substrate 139 and an ILD layer 138 above the substrate 139. In addition, the semiconductor device 100 including various layers of an interconnect structure 140 formed at the BEOL. In detail, the interconnect structure 140 includes a metal layer 137 above the ILD layer 138, an ILD layer 136, a metal layer 135, an optional separation layer 134, the ILD layer 110 above the separation layer 134, a metal layer 133, and a separation layer 132. The separation layer 120 is formed within the ILD layer 110. The various ILD layers or separation layers are used to separate the metal layers or conductive layers. There may be other layers in the interconnect structure 140, e.g., an etching stop layer, a barrier layer, a capping layer, or a hard mask layer, not shown. Furthermore, the separation layer 120, the separation layer 134, or the separation layer 132 may be any of an etching stop layer, a barrier layer, a sealant layer, a capping layer, a hard mask layer, a passivation layer, a liner, or other function layers. For example, the interconnect structure 140 may further include a sealant layer above, below, or adjacent to the separation layer 120. Furthermore, a layer, e.g., an ILD layer, a separation layer, a metal layer or conductive layer, may contain multiple sublayers.

In embodiments, the ILD layer 110 is between a first layer and a second layer of the interconnect structure 140. As shown in FIG. 1, the first layer is the separation layer 134 and the second layer is the metal layer 133. The metal layer 133 may include more than one metal electrode. The metal layer 133 may include multiple metal electrodes substantially aligned with each other horizontally or vertically. The separation layer 134 may be optionally. In some embodiments, the ILD layer 110 may be between two metal layers to separate the two metal layers, e.g., to separate the metal layer 135 and the metal layer 133. Hence, the ILD layer 110 may be between a first layer and a second layer, where the first layer or the second layer may be a metal layer, or another ILD layer. In addition, the ILD layer 110 is separated from the ILD layer 136 by the separation layer 134. The ILD layer 136 may be referred to as an under layer of the ILD layer 110. The ILD layer 136 and the ILD layer 110 may contain the same or different dielectric materials.

In embodiments, the ILD layer 110 has a first surface 111 adjacent to the first layer, e.g., the separation layer 134, and a second surface 113 adjacent to the second layer, e.g., the metal layer 133. The ILD layer 110 has a first height H1 measured vertically between the first surface 111 and the second surface 113. The ILD layer 110 has a length L1 measured horizontally in parallel with a surface of the substrate 139.

In embodiments, the separation layer 120 is shorter than the ILD layer 110 and contained within the ILD layer 110, hence may be referred to as an intermediate separation layer. The separation layer 120 has a first surface 121 opposite to the first surface 111 of the ILD layer 110, and a second surface 123 opposite to the second surface 113 of the ILD layer 110.

In embodiments, the ILD layer 110 includes a first area 101 with the first height H1 to extend from the first surface 111 of the ILD layer 110 to the second surface 113 of the ILD layer 110. The ILD layer 110 further includes a second area 102 with a second height H2 to extend from the first surface 111 of the ILD layer 110 to the first surface 121 of the separation layer 120, where the first height H1 is larger than the second height H2. In addition, the separation layer 120 has a length L2 measured horizontally in parallel with the surface of the substrate 139, where the length L2 is shorter than the length L1 of the ILD layer 110. The semiconductor device 100 may have at least two different kinds of separation layers. For example, the separation layer 134 extends horizontally with a length substantially same as the length L1 of the ILD layer 110. The ILD layer 110 includes a third area 103 with a third height H3 to extend from the second surface 123 of the separation layer 120 to the second surface 113 of the ILD layer 110, and vertically aligned with the second area 102, where the first height H1 is larger than the third height H3. In other words, the intermediate separation layer 120 divides a part of the ILD layer 110 into two areas, the second area 102 and the third area 103. While the ILD layer 136 may be referred to as an under layer of the ILD layer 110, the area 102 may be referred to as a middle ILD layer, and the area 103 may be referred to as a top ILD layer.

In embodiments, the second area 102 of the ILD layer 110 may include one or more active or passive devices, e.g., a transistor, a capacitor, a diode, a resistor, an inductor, a fuse, a transformer, or a sensor. For example, the second area 102 includes a transistor with a gate electrode 119, a channel layer 122 separated from the gate electrode 119 by a gate dielectric layer 112, a source electrode 115, a drain electrode 116 separated from the gate electrode 119 by a spacer 114. In addition, the second area 102 includes various isolation areas, e.g., an isolation area 117, an isolation area 118 to separate the transistor from another transistor or other device vertically. Furthermore, the gate electrode 119 is coupled to a via 143 through the separation layer 134, and further coupled to a metal electrode 142 in the metal layer 135. On the other hand, the source electrode 115 is coupled to a via 141 through the separation layer 120 to be coupled to a metal electrode 138 at the metal layer 133. Therefore, the transistor is accessible from the under layer, e.g., the ILD layer 136, and from the top ILD layer, e.g., the area 103 of the ILD layer 110. Moreover, the first area 101 may contain a via 145 vertically through the ILD layer 110, so that the via 145 is longer than the via 143 through the separation layer 134, or longer than the via 141 through the third area 103 and the separation layer 120. In some embodiments, the second area 103 may not exist and the metal layer 133 or the metal electrode 138 may be in direct contact with the separation layer 120.

In embodiments, the substrate 139 may include a material selected from the group consisting of a silicon substrate, a glass substrate, a metal substrate, and a plastic substrate. The ILD layer 110, the ILD layer 136, or the ILD layer 138 may include a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass. The separation layer 120, the separation layer 134, or the separation layer 132, may include a material different from the dielectric material for the ILD layers, e.g., the ILD layer 110. For example, the separation layer 120, the separation layer 134, or the separation layer 132 may include an etching stop layer, and the etching stop layer may include boron doped Si, boron doped Ge, boron doped SiGe, phosphorus doped Si, phosphorus doped Ge, or phosphorus doped SiGe. The source electrode 115, the drain electrode 116, or the gate electrode 119 may include a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

In embodiments, the channel layer 122 may include a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Figure 2:
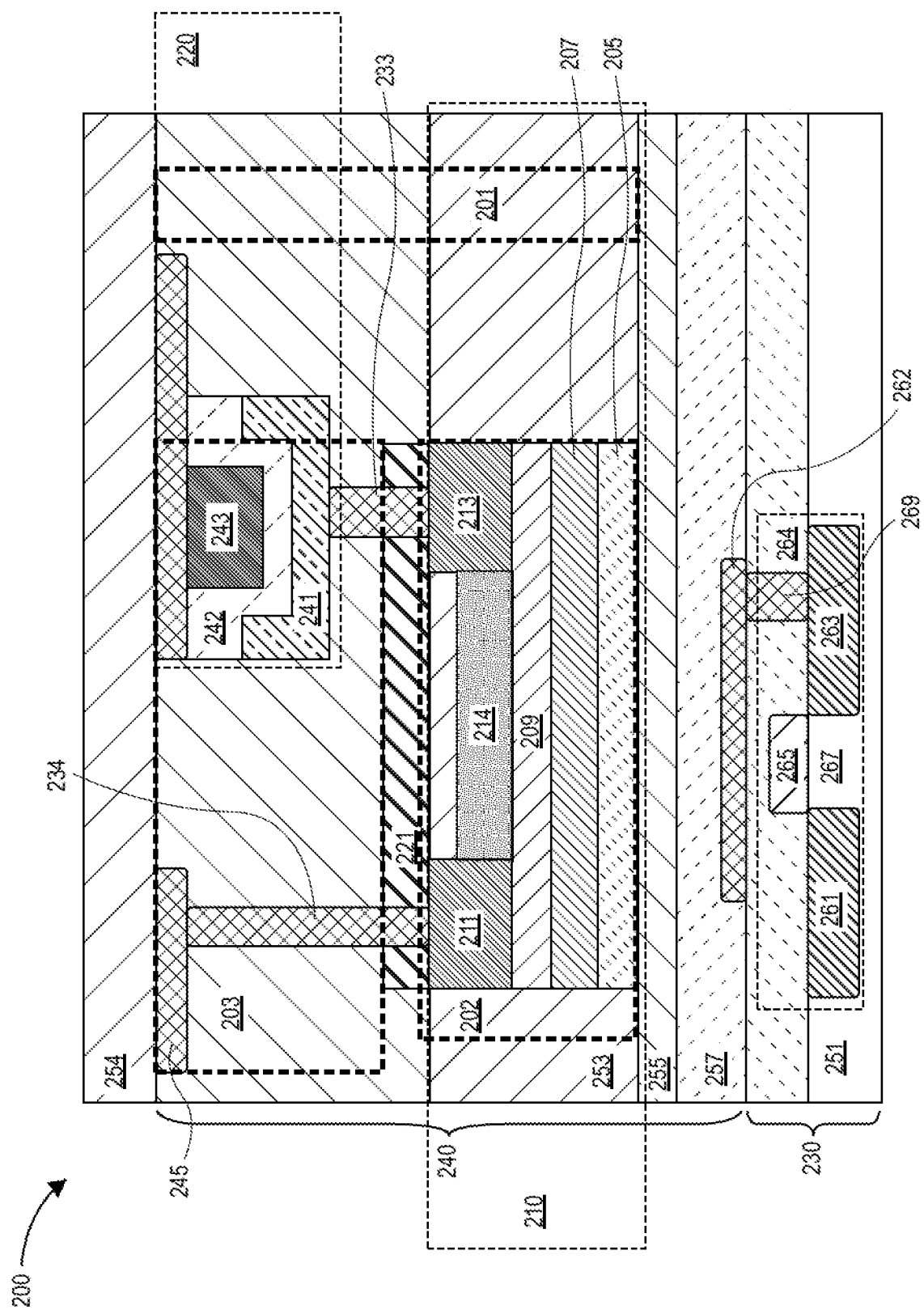
FIG. 2 schematically illustrates a diagram of a memory cell including an intermediate separation layer within an ILD layer in BEOL, in accordance with some embodiments.

FIG. 2 schematically illustrates a diagram of a memory cell 200 including an intermediate separation layer 221 within an ILD layer 253 in BEOL, in accordance with some embodiments. In embodiments, the separation layer 221 and the ILD layer 253 may be similar to the separation layer 120 and the ILD layer 110 as shown in FIG. 1.

In embodiments, the BEOL may include an interconnect structure 240 with multiple layers, e.g., an ILD layer 253, an ILD layer 254, an ILD layer 257, and a separation layer 255 to separate the ILD layer 257 and the ILD layer 253, all above a substrate 251. The separation layer 221 is shorter than the ILD layer 253 and is contained within the ILD layer 253. The interconnect structure 240 includes a TFT 210 coupled to a capacitor 220 to form a memory cell. The capacitor 220 includes a bottom plate 241 and a top plate 243 separated by a capacitor dielectric layer 242. The TFT 210 includes a source electrode 211, a drain electrode 213, a gate electrode 205 above the substrate 251, a channel layer 209 including a channel material, separated from the gate electrode 205 by a gate dielectric layer 207, and a capping layer 214 above the channel layer 209. The drain electrode 213 is coupled to the bottom plate 241 of the capacitor 220 by a short via 233. The source electrode 211 is coupled to a metal electrode 245 by a short via 234. The short via 233 and the short via 234 may connect two conductors within a same ILD layer. The top plate 243 of the capacitor 220 may be or coupled to a metal electrode located in a first metal layer, while the gate electrode 205 of the TFT 210 is coupled to a metal electrode located in a second metal layer, and the ILD layer 253 is between the first metal layer and the second metal layer.

In embodiments, the separation layer 221 is above the TFT 210 to seal the TFT 210. The ILD layer 253 includes a first area 201 that extends from a first surface of the ILD layer 253 to a second surface of the ILD layer 253. The separation layer 221 separates a part of the ILD layer 253 into a second area 202 and a third area 203, which both have a shorter height than a height of the first area 201. The first area 201, the second area 202, and the third area 203, may be similar to the first area 101, the second area 102, and the third area 103 as shown in FIG. 1.

In embodiments, the gate electrode 205 may be coupled to a word line of a memory array, the top plate 243 of the capacitor 220 may be coupled to a bit line of the memory array, and the source electrode 211 may be coupled to a source line of the memory array.

In embodiments, the BEOL 240 may be formed on the FEOL 230. The FEOL 230 may include the substrate 251. In addition, the FEOL 230 may include other devices, e.g., a transistor 264. In embodiments, the transistor 264 may be a FEOL transistor, including a source 261, a drain 263, and a gate 265, with a channel 267 between the source 261 and the drain 263 under the gate 265. Furthermore, the transistor 264 may be coupled to interconnects, e.g., the conductor 262 located in the ILD layer 257, through a via 269.

Figure 3:
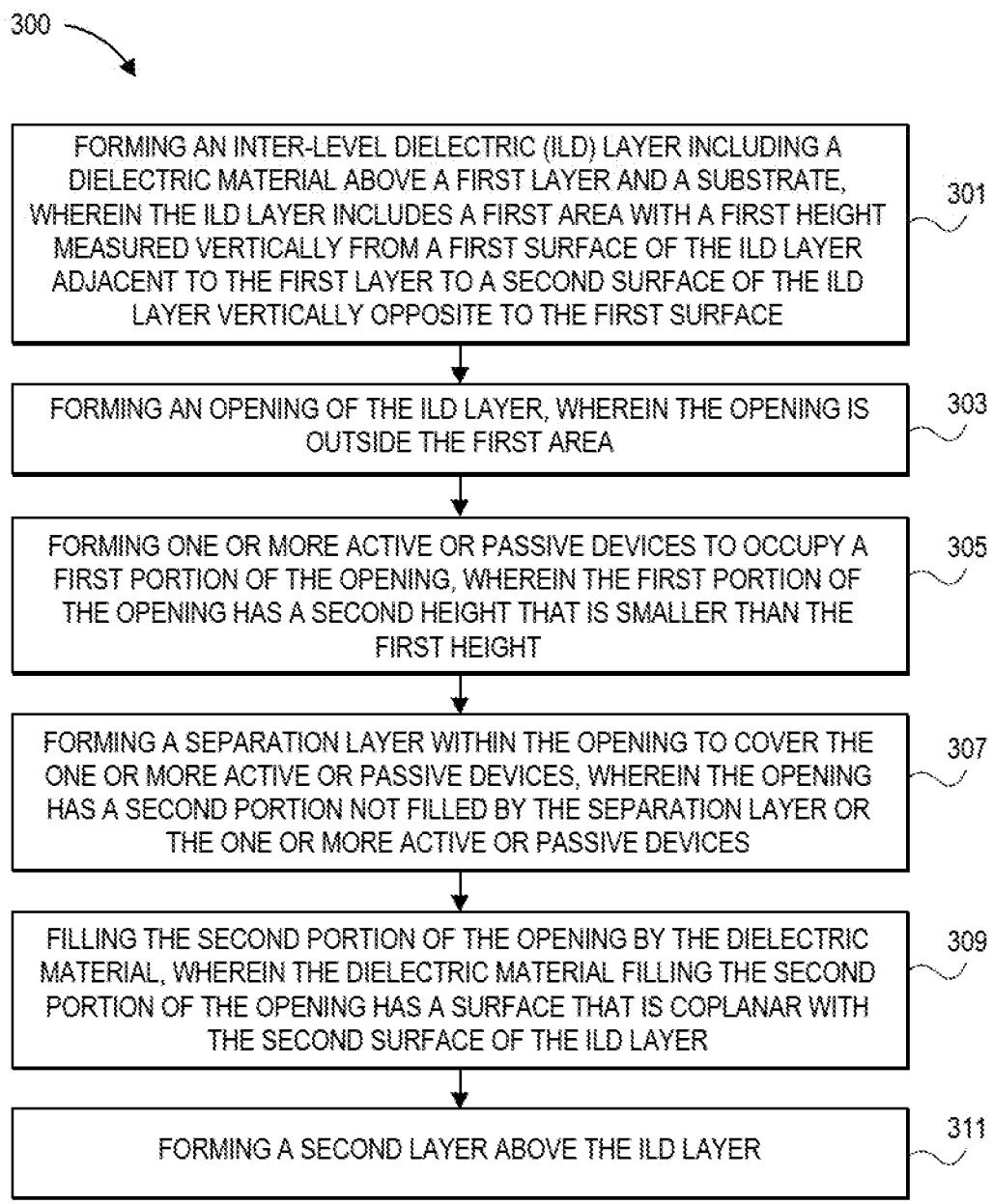
FIG. 3 illustrates a process for forming a semiconductor device including an intermediate separation layer within an ILD layer in BEOL, in accordance with some embodiments.

FIG. 3 illustrates a process 300 for forming a semiconductor device including a separation layer within a dielectric layer, in accordance with some embodiments. In embodiments, the process 300 may be applied to form the semiconductor device 100 including the separation layer 120 within the dielectric layer 110 as shown in FIG. 1.

At block 301, the process 300 may include forming an ILD layer including a dielectric material above a first layer and a substrate, where the ILD layer includes a first area with a first height measured vertically from a first surface of the ILD layer adjacent to the first layer to a second surface of the ILD layer vertically opposite to the first surface. For example, the process 300 may include forming the ILD layer 110 including a dielectric material above a first layer, e.g., the separation layer 134, and the substrate 139, where the ILD layer 110 includes a first area 101 with a first height H1, as shown in FIG. 1.

At block 303, the process 300 may include forming an opening of the ILD layer, where the opening is outside the first area. For example, the process 300 may include forming an opening of the ILD layer 110, where the opening may occupy the area of the second area 102, the third area 103, and the separation layer 120, which are all outside the first area 101.

At block 305, the process 300 may include forming one or more active or passive devices to occupy a first portion of the opening, where the first portion of the opening has a second height that is smaller than the first height. For example, the process 300 may include forming the transistor including the gate electrode 119, the source electrode 115, and the drain electrode 116 within the second area 102, where the first portion of the opening is the second area 102. The second area 102 has the height H2 smaller than the first height H1.

At block 307, the process 300 may include forming a separation layer within the opening to cover the one or more active or passive devices, wherein the opening has a second portion not filled by the separation layer or the one or more active or passive devices. For example, the process 300 may include forming the separation layer 120 within the opening to cover the transistor including the gate electrode 119, the source electrode 115, wherein the opening has a second portion, corresponding to the third area 103, not filled by the separation layer 120 or the transistor.

At block 309, the process 300 may include filling the second portion of the opening by the dielectric material, wherein the dielectric material filling the second portion of the opening has a surface that is coplanar with the second surface of the ILD layer. For example, the process 300 may include filling the second portion of the opening by the dielectric material, where the dielectric material filling the second portion of the opening to have a surface that is coplanar with the second surface of the ILD layer. The filled second portion becomes the third area 103.

At block 311, the process 300 may include forming a second layer above the ILD layer. For example, the process 300 may include forming a second layer, e.g., the metal layer 133, above the ILD layer 110.

In addition, the process 300 may include additional operations to form other layers, e.g., encapsulation layers, insulation layers, not shown.

The process 300 is shown only for illustration purposes. Other methods can be used to form a semiconductor device including a separation layer within a dielectric layer. For example, the process may form one or more active or passive devices, e.g., the transistor including the gate electrode 119, the source electrode 115, and the drain electrode 116 above the first layer, e.g., the separation layer 134. Afterwards, the process 300 may deposit a first dielectric layer covering the one or more active or passive devices, including the second area 102, and further extending to a portion of the first area 101, and further planarize the first dielectric layer with the one or more active or passive devices. Furthermore, the process 300 may form the separation layer 120 over the area 102. Moreover, the process 300 may form a second dielectric layer with the same dielectric material as the first dielectric layer. The second dielectric layer covers the separation layer 120 over the area 102, but merges with the portion of the first dielectric layer in the first area 101 to form one single continuous area as the first area 101. Afterwards, the via 141 may be formed within the third area 103, or the via 145 may be formed in the first area 101. There may be many other ways to form the semiconductor device 100 including the separation layer 120 within the dielectric layer 110 as shown in FIG. 1.

Figure 4:
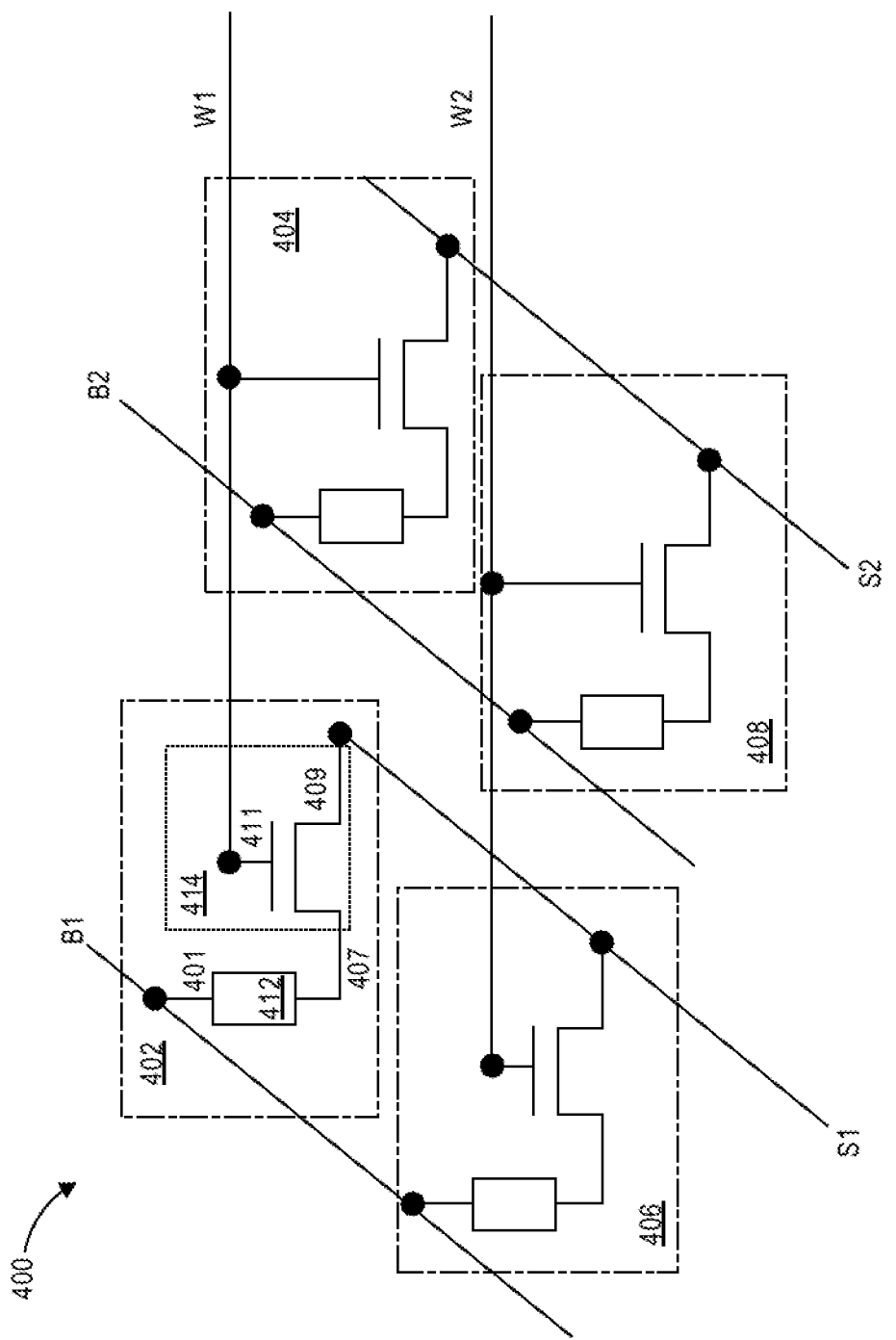
FIG. 4 schematically illustrates a memory array with multiple memory cells including a transistor and a capacitor formed at the BEOL, in accordance with some embodiments.

FIG. 4 schematically illustrates a memory array 400 with multiple memory cells (e.g., a memory cell 402, a memory cell 404, a memory cell 406, and a memory cell 408), where a transistor, e.g., a transistor 414, may be a selector of a memory cell, e.g., the memory cell 402, in accordance with various embodiments. In embodiments, the memory cell 402, or other memory cells may be an example of the memory cell 200, as shown in FIG. 2, which includes the separation layer 221. The transistor 414 may be a TFT, similar to the TFT 210 as shown in FIG. 2.

In embodiments, the multiple memory cells may be arranged in a number of rows and columns coupled by bitlines, e.g., bitline B1 and bitline B2, wordlines, e.g., wordline W1 and wordline W2, and source lines, e.g., source line Si and source line S2. The memory cell 402 may be coupled in series with the other memory cells of the same row, and may be coupled in parallel with the memory cells of the other rows. The memory array 400 may include any suitable number of one or more memory cells.

In embodiments, multiple memory cells, such as the memory cell 402, the memory cell 404, the memory cell 406, and the memory cell 408, may have a similar configuration. For example, the memory cell 402 may include the transistor 414 coupled to a storage cell 412 that may be a capacitor, which may be called a 1T1C configuration. The memory cell 402 may be controlled through multiple electrical connections to read from the memory cell, write to the memory cell, and/or perform other memory operations.

The transistor 414 may be a selector for the memory cell 402. A wordline W1 of the memory array 400 may be coupled to a gate electrode 411 of the transistor 414. When the wordline W1 is active, the transistor 414 may select the storage cell 412. A bitline B1 of the memory array 400 may be coupled to an electrode 401 of the storage cell 412, while another electrode 407 of the storage cell 412 may be shared with the transistor 414. In addition, a source line S1 of the memory array 400 may be coupled to another electrode, e.g., an electrode 409 of the transistor 414. The shared electrode 407 may be a drain electrode of the transistor 414, while the electrode 409 may be a source electrode of the transistor 414. A drain electrode and a source electrode may be used interchangeably herein. Additionally, a source line and a bit line may be used interchangeably herein.

In some embodiments, for the memory array 400, e.g., an eDRAM memory array, multiple memory cells may have source lines or bitlines coupled together and have a constant voltage. In some embodiments, a common connection may be shared among all the rows and all the columns of the memory array 400. When such sharing occurs, the bitline and source line may not be interchangeable.

In various embodiments, the memory cells and the transistors, e.g., the memory cell 402 and the transistor 414, included in the memory array 400 may be formed in BEOL, as shown in FIG. 2. For example, the transistor 414 may be illustrated as the vertical TFT 210 shown in FIG. 2 at the BEOL, and the storage cell 412 may be the capacitor 220 shown in FIG. 2. In addition, the memory array 400 may be formed in higher metal layers, e.g., metal layer 3 and/or metal layer 4, of the integrated circuit above the active substrate region, and may not occupy the active substrate area that is occupied by conventional transistors or memory devices.

Figure 5:
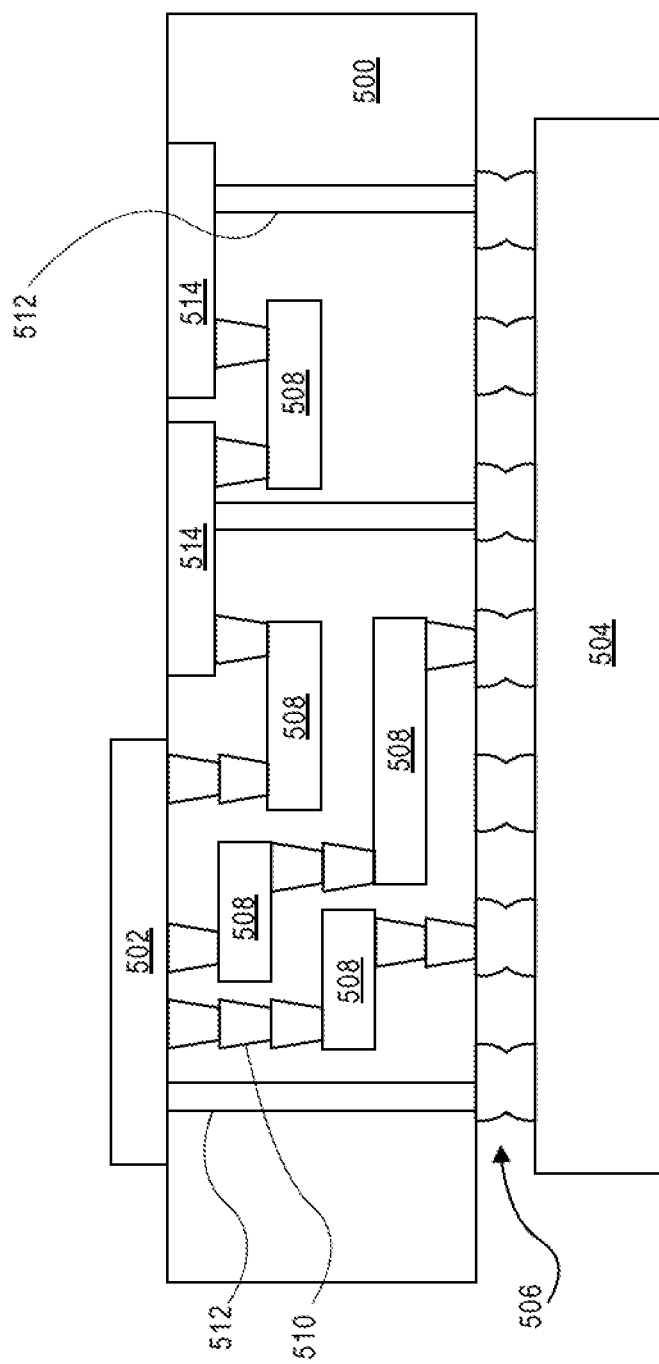
FIG. 5 schematically illustrates an interposer implementing one or more embodiments of the disclosure, in accordance with some embodiments.

FIG. 5 illustrates an interposer 500 that includes one or more embodiments of the disclosure. The interposer 500 is an intervening substrate used to bridge a first substrate 502 to a second substrate 504. The first substrate 502 may be, for instance, a substrate support for a memory cell, e.g., the memory cell 200, as shown in FIG. 2, which includes the capacitor 220 and the separation layer 221. The second substrate 504 may be, for instance, a memory module, a computer motherboard, or another integrated circuit die. For example, the second substrate 504 may be a memory module including the memory array 400 as shown in FIG. 4. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, or other group III-V and group IV materials.

The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, or electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments of the disclosure, apparatuses or processes disclosed herein may be used in the fabrication of interposer 500.

Figure 6:
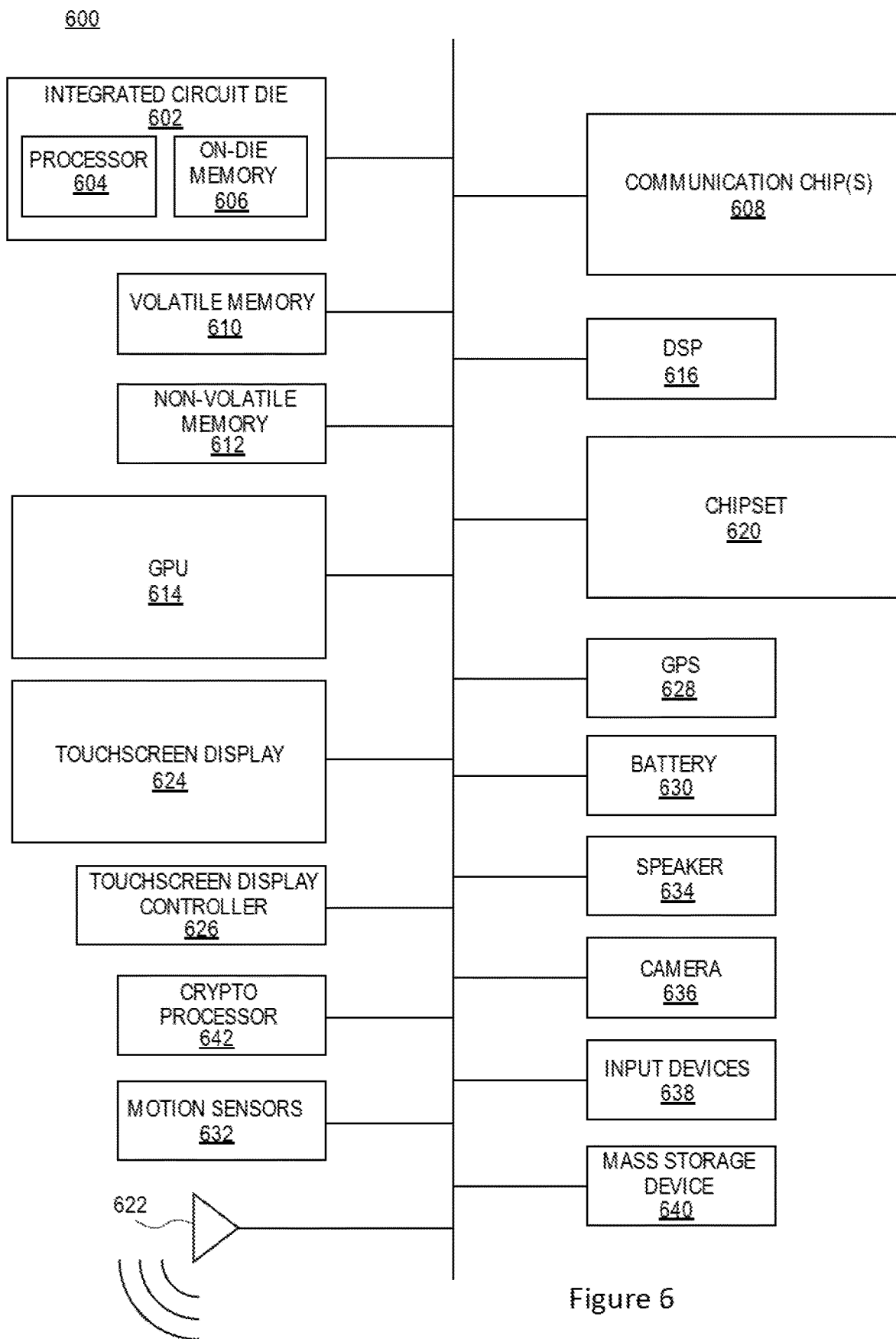
FIG. 6 schematically illustrates a computing device built in accordance with an embodiment of the disclosure, in accordance with some embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606 may include a memory cell, e.g., the memory cell 200, as shown in FIG. 2, which includes the capacitor 220 and the separation layer 221.

In embodiments, the computing device 600 may include a display or a touchscreen display 624, and a touchscreen display controller 626. A display or the touchscreen display 624 may include a FPD, an AMOLED display, a TFT LCD, a micro light-emitting diode (μLED) display, or others.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure, e.g., the memory cell 200, as shown in FIG. 2, which includes the capacitor 220 and the separation layer 221; the semiconductor device 100 including the separation layer 120; or a semiconductor device formed following the process 300.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some non-limiting Examples are provided below.

Example 1 may include a semiconductor device, comprising: an interconnect structure above a substrate, wherein the interconnect structure includes: an inter-level dielectric (ILD) layer between a first layer and a second layer, wherein the ILD layer has a first surface adjacent to the first layer, and a second surface adjacent to the second layer, a first height measured vertically between the first surface and the second surface, and a length of the ILD layer measured horizontally in parallel with a surface of the substrate; a separation layer within the ILD layer, wherein the separation layer has a first surface opposite to the first surface of the ILD layer, and a second surface opposite to the second surface of the ILD layer, and wherein the ILD layer includes a first area with the first height to extend from the first surface of the ILD layer to the second surface of the ILD layer, a second area with a second height to extend from the first surface of the ILD layer to the first surface of the separation layer, and wherein the first height is larger than the second height.

Example 2 may include the semiconductor device of example 1 and/or some other examples herein, wherein the separation layer has a length measured horizontally in parallel with the surface of the substrate that is shorter than the length of the ILD layer.

Example 3 may include the semiconductor device of example 1 and/or some other examples herein, wherein the separation layer is a first separation layer, and the first layer or the second layer is a second separation layer that extends horizontally with a length substantially same as the length of the ILD layer.

Example 4 may include the semiconductor device of examples 1-3 and/or some other examples herein, wherein the first layer or the second layer is a metal layer, or another ILD layer.

Example 5 may include the semiconductor device of examples 1-3 and/or some other examples herein, wherein the second area of the ILD layer includes a transistor, a capacitor, a diode, a resistor, an inductor, a fuse, a transformer, or a sensor.

Example 6 may include the semiconductor device of examples 1-3 and/or some other examples herein, wherein the second area of the ILD layer includes a thin film transistor having a channel layer, and wherein the channel layer includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 7 may include the semiconductor device of example 6 and/or some other examples herein, wherein the ILD layer includes a third area with a third height to extend from the second surface of the separation layer to the second surface of the ILD layer, and vertically aligned with the second area, and wherein the first height is larger than the third height.

Example 8 may include the semiconductor device of example 7 and/or some other examples herein, further comprising a first via through the first area, and a second via through the third area, wherein the second via is shorter than the first via.

Example 9 may include the semiconductor device of examples 1-3 and/or some other examples herein, wherein the substrate includes a material selected from the group consisting of a silicon substrate, a glass substrate, a metal substrate, and a plastic substrate.

Example 10 may include the semiconductor device of examples 1-3 and/or some other examples herein, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

Example 11 may include the semiconductor device of examples 1-3 and/or some other examples herein, wherein the separation layer includes one or more of an etching stop layer, a barrier layer, a capping layer, or a hard mask layer.

Example 12 may include the semiconductor device of examples 1-3 and/or some other examples herein, wherein the separation layer includes an etching stop layer, and the etching stop layer includes boron doped Si, boron doped Ge, boron doped SiGe, phosphorus doped Si, phosphorus doped Ge, or phosphorus doped SiGe.

Example 13 may include the semiconductor device of examples 1-3 and/or some other examples herein, wherein the interconnect structure further includes a sealant layer above, below, or adjacent to the separation layer.

Example 14 may include the semiconductor device of examples 1-3 and/or some other examples herein, wherein the first layer is another separation layer, the ILD layer is a first ILD layer, and the semiconductor device further includes a second ILD layer separated from the first ILD layer by the first layer.

Example 15 may include a method for forming a semiconductor device, the method comprising: forming an inter-level dielectric (ILD) layer including a dielectric material above a first layer and a substrate, wherein the ILD layer includes a first area with a first height measured vertically from a first surface of the ILD layer adjacent to the first layer to a second surface of the ILD layer vertically opposite to the first surface; forming an opening of the ILD layer, wherein the opening is outside the first area; forming one or more active or passive devices to occupy a first portion of the opening, wherein the first portion of the opening has a second height that is smaller than the first height; forming a separation layer within the opening to cover the one or more active or passive devices, wherein the opening has a second portion not filled by the separation layer or the one or more active or passive devices; filling the second portion of the opening by the dielectric material, wherein the dielectric material filling the second portion of the opening has a surface that is coplanar with the second surface of the ILD layer; and forming a second layer above the ILD layer.

Example 16 may include the method of example 15 and/or some other examples herein, wherein the one or more active or passive devices includes a device selected from a transistor, a capacitor, a diode, a resistor, an inductor, a fuse, a transformer, or a sensor.

Example 17 may include the method of example 15 and/or some other examples herein, wherein the first layer is a metal layer, or another ILD layer.

Example 18 may include the method of examples 15-17 and/or some other examples herein, further comprising: forming a first via through the first area, and a second via through the dielectric material filling the second portion of the opening to be coupled with the one or more active or passive devices, wherein the second via is shorter than the first via.

Example 19 may include the method of examples 15-17 and/or some other examples herein, wherein the separation layer includes an etching stop layer, and the etching stop layer includes boron doped Si, boron doped Ge, boron doped SiGe, phosphorus doped Si, phosphorus doped Ge, or phosphorus doped SiGe.

Example 20 may include the method of examples 15-17 and/or some other examples herein, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

Example 21 may include a computing device, comprising: a circuit board; and a memory device coupled to the circuit board and including a memory array, wherein the memory array includes a plurality of memory cells, a memory cell of the plurality of memory cells includes a transistor coupled to a capacitor formed within an inter-level dielectric (ILD) layer including a dielectric material above a first layer and a substrate; wherein the transistor includes a gate electrode; a channel layer including a channel material, separated from the gate electrode by a gate dielectric layer; and a source electrode and a drain electrode above the channel layer, and wherein the gate electrode, the channel layer, the source electrode and the drain electrode are above the first layer and below a separation layer; wherein the capacitor is above the separation layer and below a second layer, and wherein the ILD layer includes a first area with a first height to extend from a first surface of the ILD layer to a second surface of the ILD layer between the first layer and the second layer, and a second area with a second height to extend between the first layer and the separation layer, and wherein the first height is larger than the second height; and wherein the drain electrode of the transistor is coupled to a bottom plate of the capacitor through the separation layer, a top plate of the capacitor is coupled to a source line of the memory array, and the gate electrode of the transistor is coupled to a word line of the memory array.

Example 22 may include the computing device of example 21 and/or some other examples herein, wherein the first layer or the second layer is a metal layer, or another ILD layer.

Example 23 may include the computing device of examples 21-22 and/or some other examples herein, wherein the channel layer of the transistor includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 24 may include the computing device of examples 21-22 and/or some other examples herein, wherein the separation layer includes an etching stop layer, and the etching stop layer includes boron doped Si, boron doped Ge, boron doped SiGe, phosphorus doped Si, phosphorus doped Ge, or phosphorus doped SiGe.

Example 25 may include the computing device of examples 21-22 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
an interconnect structure above a substrate, wherein the interconnect structure includes:
an inter-level dielectric (ILD) layer between a first layer and a second layer, wherein the ILD layer has a first surface adjacent to the first layer, and a second surface adjacent to the second layer, a first height measured vertically between the first surface and the second surface, and a length of the ILD layer measured horizontally in parallel with a surface of the substrate;
a separation layer within the ILD layer, wherein the separation layer has a first surface opposite to the first surface of the ILD layer, and a second surface opposite to the second surface of the ILD layer, and wherein the ILD layer includes a first area with the first height to extend from the first surface of the ILD layer to the second surface of the ILD layer, a second area with a second height to extend from the first surface of the ILD layer to the first surface of the separation layer, and wherein the first height is larger than the second height.

2. The semiconductor device of claim 1, wherein the separation layer has a length measured horizontally in parallel with the surface of the substrate that is shorter than the length of the ILD layer.

3. The semiconductor device of claim 1, wherein the separation layer is a first separation layer, and the first layer or the second layer is a second separation layer that extends horizontally with a length substantially same as the length of the ILD layer.

4. The semiconductor device of claim 1, wherein the first layer or the second layer is a metal layer, or another ILD layer.

5. The semiconductor device of claim 1, wherein the second area of the ILD layer includes a transistor, a capacitor, a diode, a resistor, an inductor, a fuse, a transformer, or a sensor.

6. The semiconductor device of claim 1, wherein the second area of the ILD layer includes a thin film transistor having a channel layer, and wherein the channel layer includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

7. The semiconductor device of claim 6, wherein the ILD layer includes a third area with a third height to extend from the second surface of the separation layer to the second surface of the ILD layer, and vertically aligned with the second area, and wherein the first height is larger than the third height.

8. The semiconductor device of claim 7, further comprising a first via through the first area, and a second via through the third area, wherein the second via is shorter than the first via.

9. The semiconductor device of claim 1, wherein the substrate includes a material selected from the group consisting of a silicon substrate, a glass substrate, a metal substrate, and a plastic substrate.

10. The semiconductor device of claim 1, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

11. The semiconductor device of claim 1, wherein the separation layer includes one or more of an etching stop layer, a barrier layer, a capping layer, or a hard mask layer.

12. The semiconductor device of claim 1, wherein the separation layer includes an etching stop layer, and the etching stop layer includes boron doped Si, boron doped Ge, boron doped SiGe, phosphorus doped Si, phosphorus doped Ge, or phosphorus doped SiGe.

13. The semiconductor device of claim 1, wherein the interconnect structure further includes a sealant layer above, below, or adjacent to the separation layer.

14. The semiconductor device of claim 1, wherein the first layer is another separation layer, the ILD layer is a first ILD layer, and the semiconductor device further includes a second ILD layer separated from the first ILD layer by the first layer.

15. A computing device, comprising:
a circuit board; and
a memory device coupled to the circuit board and including a memory array, wherein the memory array includes a plurality of memory cells, a memory cell of the plurality of memory cells includes a transistor coupled to a capacitor formed within an inter-level dielectric (ILD) layer including a dielectric material above a first layer and a substrate;
wherein the transistor includes a gate electrode; a channel layer including a channel material, separated from the gate electrode by a gate dielectric layer; and a source electrode and a drain electrode above the channel layer, and wherein the gate electrode, the channel layer, the source electrode and the drain electrode are above the first layer and below a separation layer;
wherein the capacitor is above the separation layer and below a second layer, and wherein the ILD layer includes a first area with a first height to extend from a first surface of the ILD layer to a second surface of the ILD layer between the first layer and the second layer, and a second area with a second height to extend between the first layer and the separation layer, and wherein the first height is larger than the second height; and
wherein the drain electrode of the transistor is coupled to a bottom plate of the capacitor through the separation layer, a top plate of the capacitor is coupled to a source line of the memory array, and the gate electrode of the transistor is coupled to a word line of the memory array.

16. The computing device of claim 15, wherein the first layer or the second layer is a metal layer, or another ILD layer.

17. The computing device of claim 15, wherein the channel layer of the transistor includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

18. The computing device of claim 15, wherein the separation layer includes an etching stop layer, and the etching stop layer includes boron doped Si, boron doped Ge, boron doped SiGe, phosphorus doped Si, phosphorus doped Ge, or phosphorus doped SiGe.

19. The computing device of claim 15, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

* * * * *